United States Patent
Kawahara et al.

(10) Patent No.: US 6,192,182 B1
(45) Date of Patent: Feb. 20, 2001

(54) DIGITAL INFORMATION SIGNAL RECORDING APPARATUS AND METHOD THEREOF

(75) Inventors: Minoru Kawahara; Shoji Kosuge; Kenji Yamasaki, all of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/200,584

(22) Filed: Nov. 27, 1998

Related U.S. Application Data

(63) Continuation of application No. PCT/JP98/01380, filed on Mar. 27, 1998.

(30) Foreign Application Priority Data

Mar. 31, 1997 (JP) .................................................. 9-081300

(51) Int. Cl.$^7$ .............................. H04N 5/782; H04N 5/76
(52) U.S. Cl. ................................. 386/46; 386/81; 386/109
(58) Field of Search .............................. 386/46, 109, 111, 386/112, 124, 40, 33, 27, 1, 81, 95, 106, 69, 35, 68; 360/32; H04N 5/782, 5/76

(56) References Cited

U.S. PATENT DOCUMENTS 5,282,049 * 1/1994 Hatakenaka et al. .................. 386/68
5,377,051 * 12/1994 Lane et al. .............................. 386/68

* cited by examiner

*Primary Examiner*—Robert Chevalier
(74) *Attorney, Agent, or Firm*—Frommer Lawrence & Haug, LLP.; William S. Frommer; Gordon Kessler

(57) ABSTRACT

A digital video signal of one frame is recorded as diagonal tracks on a magnetic tape by four recording heads. One frame is recorded as six segments (twelve tracks). Adjacent tracks is reverse azimuths. In each track of even segments, an auxiliary data sync block is recorded at the last position of a video sector v1. In each track of odd segments, an auxiliary data sync block is recorded at the beginning position of a video sector v1. Since an auxiliary data sync block is recorded at spaced positions on a tape, it can be prevented that an auxiliary data cannot be read at all on a tape scrached in the longitudinal direction.

9 Claims, 15 Drawing Sheets

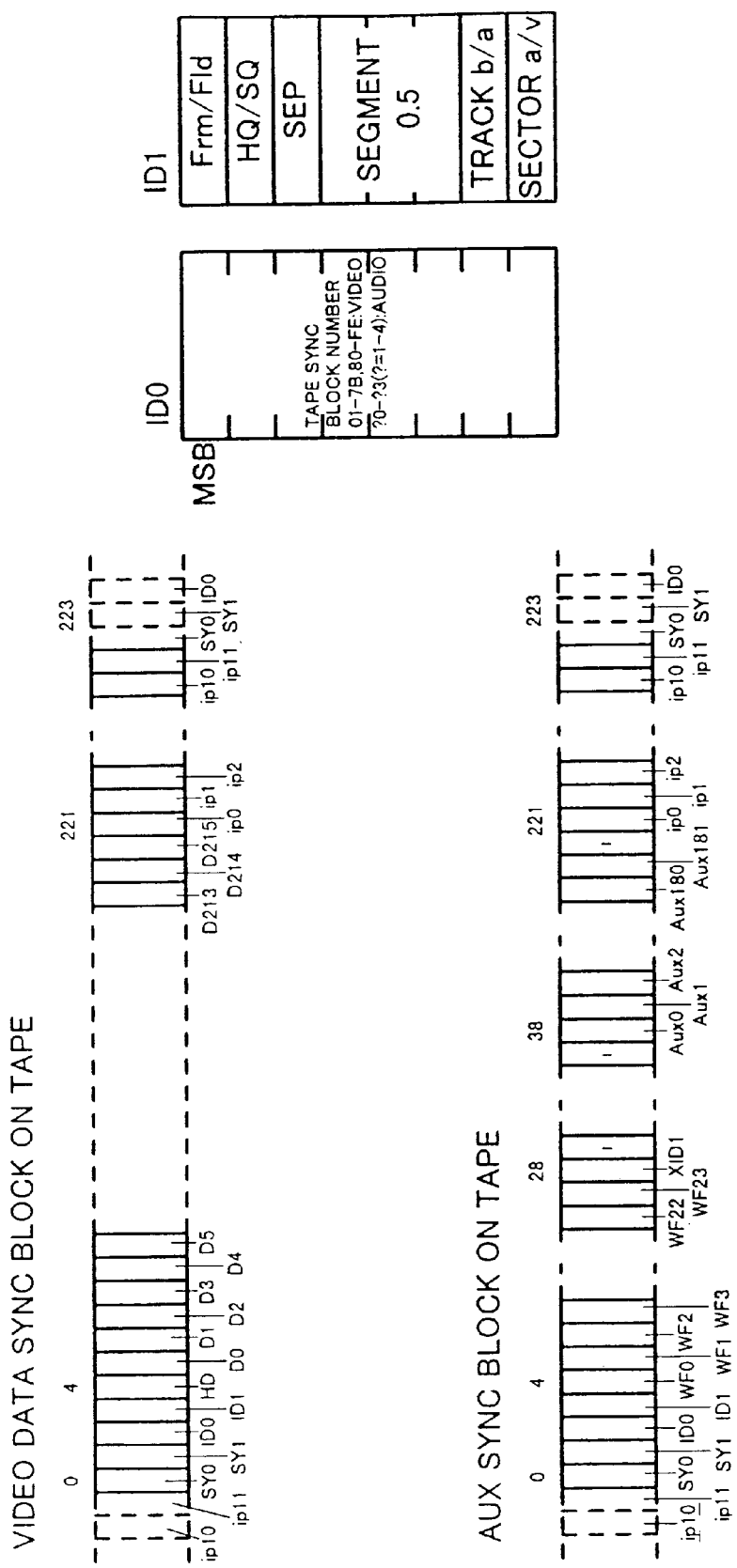

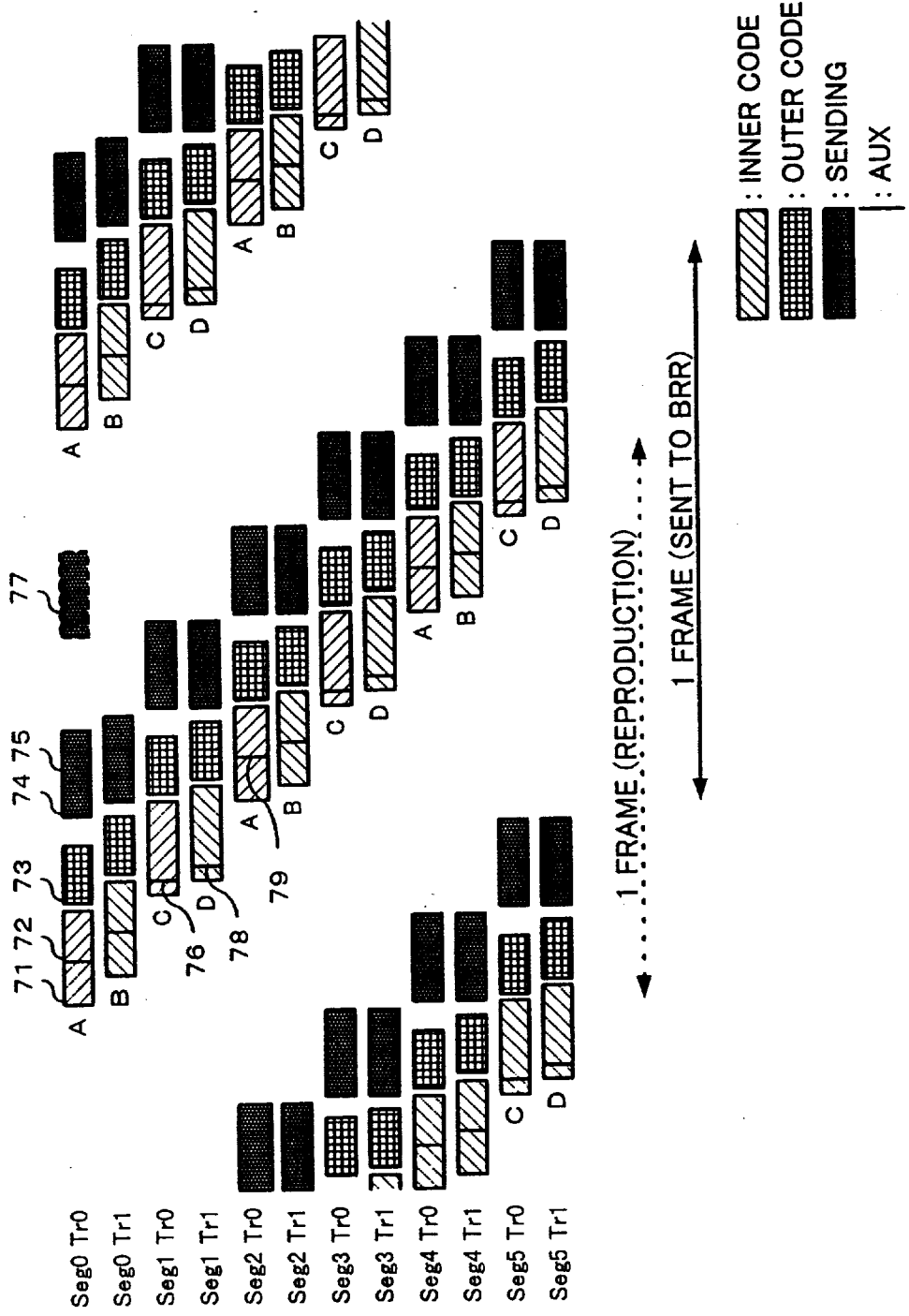

DIGITAL INFORMATION SIGNAL RECORDING APPARATUS AND METHOD THEREOF

This is a continuation of copending International Application PCT/JP98/01380 having an international filing date of Mar. 27, 1998 pending.

TECHNICAL FIELD

The present invention relates to a digital information signal recording apparatus for recording for example a digital video signal to a record medium and to a method thereof.

BACKGROUND ART

A signal processing apparatus that digitally processes a video signal (for example, a signal processing apparatus used for a digital VTR (Video Tape Recorder) that records/reproduces a high resolution video signal) compresses and encodes an input video signal. The compressed and encoded video signal is recorded to for example a video tape. To record/reproduce record data at a high data rate, a helical scan type recording/reproducing apparatus of which a magnetic tape is diagonally wound around a rotating drum and magnetic heads are disposed on the rotating drum is known. This apparatus successively records data in such a manner that diagonal tracks are formed on the magnetic tape.

When record data composed of a digital video signal and so forth is recorded on a tape, auxiliary data necessary for recording/reproducing data is also recorded. The record data is normally delimited in each data unit. In the following description, the data unit is referred to as sync block. The auxiliary data is position information on the tape (for example, time code) and information necessary for recording/reproducing process. The auxiliary data is structured as sync block and recorded on the tape. Many sync blocks are recorded on one track. One of sync blocks recorded on each track is assigned to auxiliary data. A sync block composed of auxiliary data is referred to as auxiliary data sync block.

In the conventional digital VTR, an auxiliary data sync block is recorded at the same position of each track. Thus, when a tape is scratched in the traveling direction thereof (namely, in the longitudinal direction), a situation of which auxiliary data cannot be reproduced at all sometimes takes place. Such a recording method is suitable for recording data such as a time code, for example, that is what the same contents are redundantly recorded on another track (longitudinal track). However, that method is not suitable for recording an auxiliary data that is necessary information for the reproducing process, because the reliability is very low.

DISCLOSURE OF INVENTION

Therefore, an object of the present invention is to provide a digital information signal recording apparatus for alleviating the situation of which a scratch on a tape prevents an auxiliary data sync block from being reproduced and a method thereof.

A first aspect of the present invention is a digital information signal recording apparatus for recording a digital information signal onto diagonal tracks of a tape shaped recording medium, comprising forming means of record-signal for encoding an input digital information signal with an error correction code and forming record data delimited by a predetermined data unit, and a recording means for successively recording record-data onto diagonal tracks of a tape shaped recording medium, wherein the forming means of record-signal forms a plurality of data units composed of encoded data of the input digital information signal and at least one data unit composed of auxiliary data other than the input digital information signal in the shape of record-data on one track, and wherein the record-data on one track is formed in such a manner that data units composed of the auxiliary data are recorded apart each other on the recording medium.

A second aspect of the present invention is a digital information signal recording method for recording a digital information signal onto diagonal tracks of a tape shaped recording medium, comprising the steps of encoding an input digital information signal with an error correction code and forming record-data delimited by a predetermined data unit, and successively recording record-data onto diagonal tracks of a tape shaped recording medium, wherein a plurality of data units composed of encoded data of the input digital information signal and at least one data unit composed of auxiliary data other than the input digital information signal are formed in the shape of record-data on one track, and wherein the record-data is formed in such a manner that data units composed of the auxiliary data are recorded apart each other on the recording medium.

Since record positions of data units composed of auxiliary data are spaced in the width direction of the tape shaped recording medium, even if the tape is scratched, a situation of which auxiliary data cannot be reproduced can be prevented.

BRIEF DESCRIPTION OF THE DRAWINGS

FIG. 7 is a schematic diagram for explaining the format of a sync block on a tape;

FIG. 15 is a timing chart for explaining the operation of an ECC decoder according to an embodiment of the present invention.

BEST MODE FOR CARRYING OUT THE INVENTION

Figure 1:
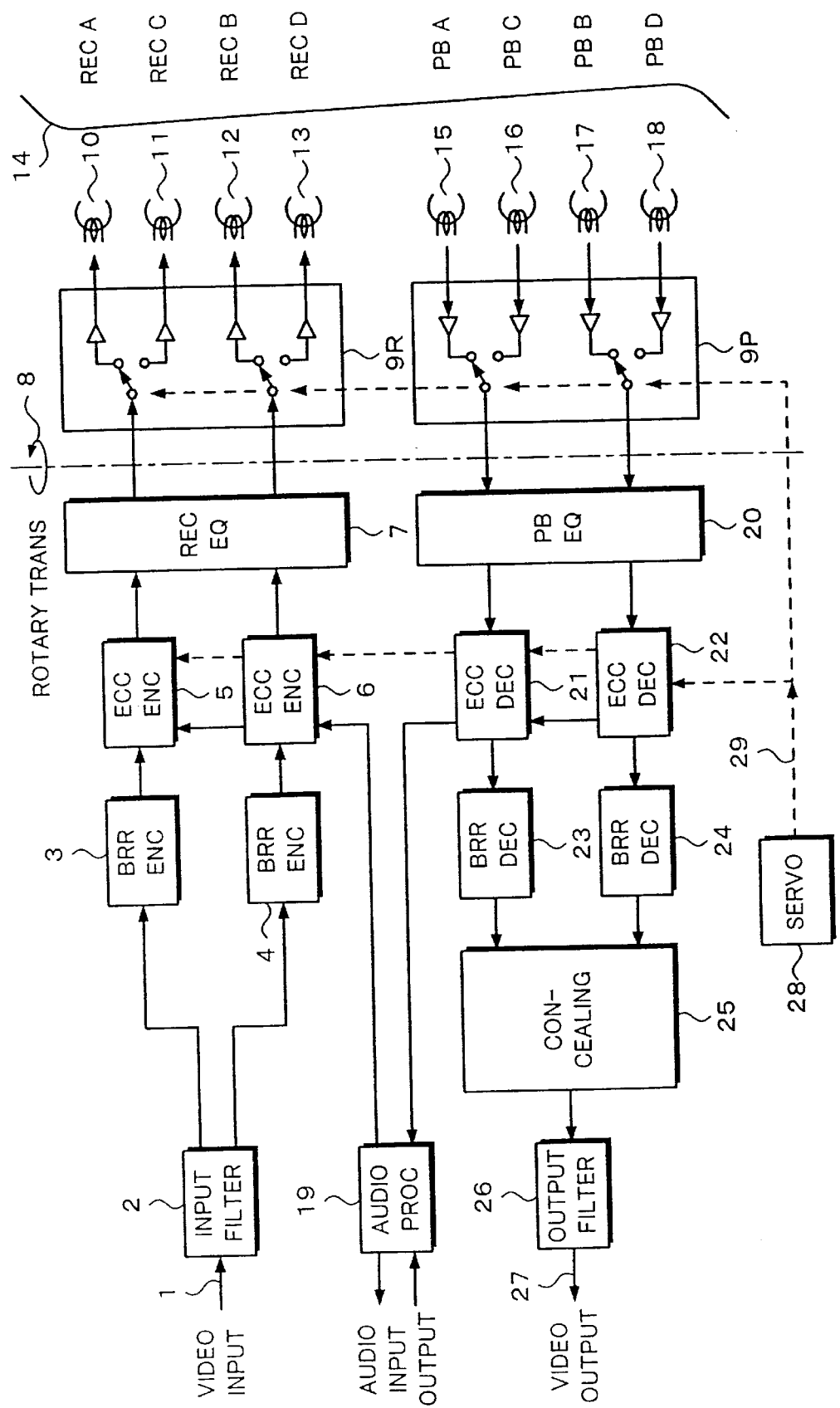
FIG. 1 is a block diagram showing an example of the structure of a recording/reproducing system according to an embodiment of the present invention.
Figure 2:
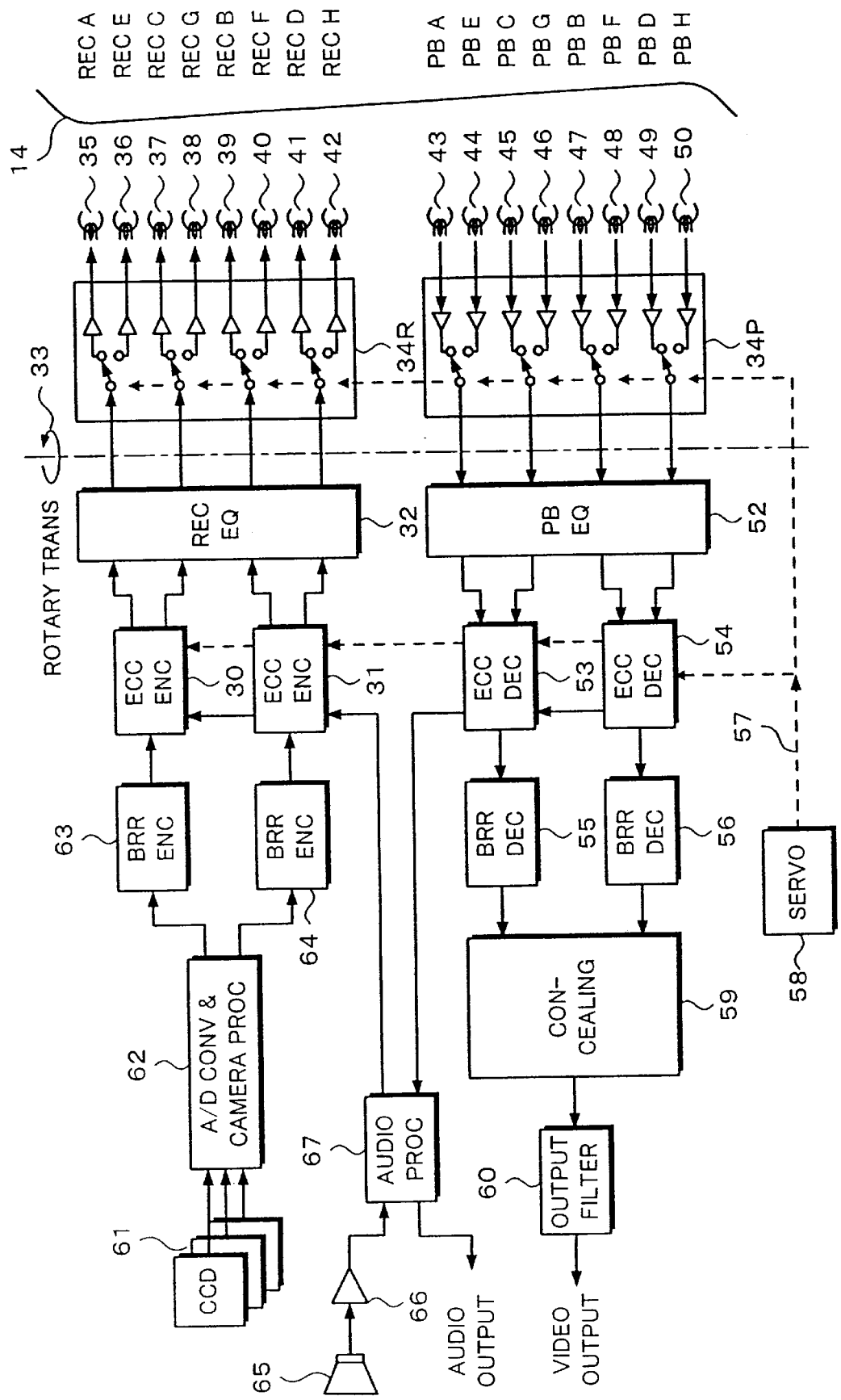
FIG. 2 is a block diagram showing another example of the structure of a recording/reproducing system according to an embodiment of the present invention.

Next, with reference to the accompanying drawings, a digital VTR that records a high resolution video signal to a magnetic tape and that reproduces a high resolution video signal from a magnetic tape will be described as an embodiment of the present invention. FIG. 1 shows the structure of a recording/reproducing system according to an embodiment of the present invention. The recoding/reproducing system shown in FIG. 2 is a four-head system having four recording heads and four reproducing heads.

In FIG. 1, a high resolution digital video signal is supplied to an input terminal 1. The digital video signal is sent to an input filter 2. The input filter 2 performs a filtering process for compressing a (4:2:2) signal to a (3:1:1) signal. The input filter 2 changes the clock frequency from 74.25 MHz to 46.40625 MHz.

In addition, the input filter 2 converts the (3:1:1) signal into data of two channels. The data rate of data of each channel is 46.40625 MHz. The data of two channels is sent to BRR (Bit Rate Reduction) encoders 3 and 4 and error correction code encoders (ECC encoders) 5 and 6, respectively. The BRR encoders 3 and 4 perform a compression encoding process. The EEC encoders 5 and 6 perform an error correction code encoding process.

In this example, the BRR encoders 3 and 4 adaptively selects an intra-field compression encoding process and an intra-frame compression encoding process and shuffle DCT blocks. When a picture does not largely move between fields, DCT blocks are composed of data in a field. On the other hand, when a picture largely moves between fields, DCT blocks are composed of data in a field. Each of the BRR encoders 3 and 4 switches the process between the intra-field compression encoding process and the intra-frame compression encoding process for each frame as the minimum unit. The formation that has been compressed in either method is recorded/reproduced as a header of a sync block and a part of auxiliary data.

The ECC encoders 5 and 6 perform a product code encoding process and generate record data composed of successive sync blocks. The ECC encoders 25 and 26 perform an outer code encoding process, add an ID portion that includes information of the order of sync blocks and various flags to each sync block recorded on the tape, and then perform an inner code encoding process. In this example, the encoding range with the inner code includes the ID portion. One sync block includes the parity of the inner code and a sync signal that represents the beginning thereof. One sync block is the minimum data unit of data that is recorded/reproduced. As will be described later, there are two types of sync blocks that are video data sync blocks and auxiliary data sync blocks. One auxiliary data sync block is recorded on one track.

Output data of the ECC encoders 5 and 6 are sent to a recording equalizer 7. Record data of two channels received from the recoding equalizer 7 is sent to a recording head driver 9R through a rotary transformer 8. The recording head driver 9R has switching circuits that select recording amplifiers and recording heads. The recoding head driver 9R is connected to recording heads 10, 11, 12, and 13. The recording heads 10 to 13 record data on a magnetic tape 14.

Next, the structure on the reproducing side will be described. Signal recorded on the magnetic tape 14 are reproduced by reproducing heads 15 to 18. Reproduced signals are sent to a reproducing head driver 9P. The reproducing head driver 9P outputs reproduced signals of two channels. The reproduced signals are sent to a reproducing equalizer 20 through the rotary transformer 8. The reproducing equalizer 20 equalizes the reproduced signals and outputs reproduced serial data. In addition, the reproducing equalizer 20 generates a clock signal in synchronization with the reproduced signals and sends the clock signal to ECC decoders 21 and 22 along with the data.

Output signals (reproduced serial data) of two channels of the reproducing equalizer 20 are sent to ECC decoders 21 and 22, respectively. The ECC decoders 21 and 22 detect the synchronization of input data, changes the record rate to the system clock, and correct various errors on the tape. In other words, the ECC decoders 21 and 22 correct an error with an inner code of an error correction code. The inner code is completed in one sync block. When an error can be corrected with an inner code, the ECC decoders 21 and 22 correct the error. Otherwise, the ECC decoders 21 and 22 place an error flag to the position of the error. Next, the ECC decoders 21 and 22 correct an error with an outer code and perform an erasure correcting process with reference to the error flag. Thus, most of the errors are corrected. However, when there is a long error in the longitudinal direction, the ECC decoders 21 and 22 may not correct such an error. At this point, the ECC decoders 21 and 22 detect such an error in the detecting performance of an outer code and set an error flag at the position of the error word.

The ECC decoder 21 and 22 output data and word error flag as each sync block corresponding to the clock signal of 46.40625 MHz. Output data of the ECC decoder 21 and 22 is sent to BRR decoders 23 and 24. The BRR decoders 23 and 24 perform a variable length code decoding process, an inverse DCT transforming process, and a deshuffling process and decode the compressed signal. The BRR decoders 23 and 24 perform an intra-field decoding process/intra-frame decoding process corresponding to the intra-field encoding process/intra-field encoding process performed by the BRR encoders 23 and 24. The information that represents the encoding type is placed in each auxiliary data sync block and in header information (ID) of each sync block.

Output signals of the BRR decoders 23 and 24 are sent to a concealing circuit 25 along with the error flag for the concealing process. The concealing circuit 25 conceals an error that exceeds the error correcting capability of the ECC decoders 21 and 22. For example, the concealing circuit 25 interpolates in a predetermined manner an error portion that has not been corrected. For example, when the BRR decoders 23 and 24 decompress data, they determine an error of a DCT coefficient corresponding to the word error flag set at the error position. When a DC coefficient or a low order AC coefficient that is a relatively important coefficient has an error, the BRR decoders 23 and 24 do not decode such a DCT block. In this case, the BRR decoders 23 and 24 send the conceal flag to the concealing circuit 25. The concealing circuit 25 interpolates the relevant DCT block.

An output signal of the concealing circuit 25 is sent to an output filter 26. The output filter 26 changes the clock frequency from 46.40625 MHz to 74.25 MHz. In addition, the output filter 26 converts (3:1:1) signals of two channels into a (4:2:2) signal and outputs a reproduced video signal.

Input audio data is sent to an audio processor 19. The audio processor 19 performs a predetermined process and sends the resultant data to the ECC decoders 5 and 6. As with video data, the ECC decoders 5 and 6 encode audio data of each channel with a product code.

The four recording heads 10, 11, 12, and 13 are disposed on the rotating drum that rotates at for example 90 Hz. The pair of the recording heads 10 and 12 are adjacently disposed on the rotating drum. The pair of the recording heads 11 and 13 are adjacently disposed on the rotating drum. The azimuth of the recording head 10 is different from the azimuth of the recording head 12. Likewise, the azimuth of the recording head 11 is different from the azimuth of the recording head 13. The recording heads 10 and 11 are disposed at an interval of 180°. The azimuth of the recording head 10 is the same as the azimuth of the recording head 11. In addition, the reproducing heads 15, 16, 17, and 18 are disposed on the rotating drum. The relation between the positions and azimuths of the reproducing heads 15, 16, 17, and 18 is the same as the relation between the positions and azimuths of the recording heads 10, 11, 12, and 13.

A magnetic tape is wound around the rotating drum at a winding angle of 180°. Data is successively recorded as diagonal tracks on the magnetic tape. The recording head driver 9R has switching circuits that switch record signals in synchronization with the rotation of heads along with recording amplifiers. Likewise, the reproducing head driver 9P has amplifiers and switching circuits. A servo circuit 28 sends switching pulses 29 (represented by dashed lines) in synchronization with the rotation of heads to the switching circuits, the ECC encoders 5 and 6, and the ECC decoders 21 and 22.

Assuming that the recording heads 10, 11, 12, and 13 and the reproducing heads 15, 16, 17, and 18 are denoted by A, B, C, and D as shown in FIG. 1, tracks A and B corresponding to the recording heads A and B are simultaneously formed by the recording heads 10 and 12, respectively. In addition, tracks C and D corresponding to the recording heads C and D are simultaneously formed by the recording heads 11 and 13, respectively. In the embodiment of the present invention, record data of one frame (⅟₃₀ seconds) of a video signal is recorded on successive 12 tracks. A segment is composed of adjacent two tracks with different azimuths (a pair of A and B channels and a pair of C and D channels). Thus, one frame of a video signal is composed of six segments. The six segments are designated segment numbers 0 to 5. Audio data of four channels is recorded at a center portion of each track so that the audio data is surrounded by video data.

FIG. 2 is a block diagram showing another example of the structure of a digital VTR according to the present invention. FIG. 2 shows an eight-head system of which a video camera and a digital VTR are integrally structured and eight recording heads and eight reproducing heads are disposed. A CCD 61 photographs a color picture. An A/D converting and camera coprocessor 62 converts a signal received from the CCD 81 into video signals of two channels. The video signals of two channels are sent to BRR encoders 63 and 64. The BRR encoders 63 and 64 compress the video signals of two channels and send the compressed signals to ECC encoders 30 and 31.

The ECC encoders 30 and 31 divide each channel into two channels and form record data of four channels. The record data of four channels is sent to eight recording heads 35, 36, 37, 38, 39, 40, 41, and 42 through a recording equalizer 32, a rotary transformer 33, and a recording head driver 34R. The recording heads 35, 36, 37, 38, 39, 40, 41, and 42 record the data of four channels as diagonal tracks to a magnetic tape 14.

As with the recording heads, reproducing heads 43, 44, 45, 46, 47, 48, 49, and 50 are disposed. Output signals of the reproducing heads are sent to a reproducing head driver 34P. The reproducing head driver 34P outputs reproduced signals of four channels. The reproduced signals of four channels are sent to a reproducing equalizer 52 through the rotary transformer 33. output signals of the reproducing equalizer 52 are sent to ECC decoders 53 and 54. The ECC decoders 53 and 54 correct errors of the signals received from the reproducing equalizer 52. The ECC decoders 53 and 54 output reproduced data of two channels to BRR decoders 55 and 56. The BRR decoders 55 and 56 decode the data of two channels received from the ECC decoders 53 and 54.

Switching pulses 57 received from a servo circuit 58 are sent to the ECC encoders 30 and 31, the ECC decoders 53 and 54, the recording head driver 34R, and the reproducing head driver 34P. The switching pulses 57 cause the ECC encoders 30 and 31, the ECC decoders 53 and 54, the recording head driver 34R, and the reproducing head driver 34P to synchronize with the rotation of the heads.

The BRR decoders 55 and 56 send decompressed data to a concealing circuit 59. The concealing circuit 59 interpolates an error that has not been corrected. Output data of the concealing circuit 59 is sent to an output filter 60. The output filter 60 converts a (3:1:1) signal into a (4:2:2) signal and sends the resultant signal as an output video signal.

In the structure shown in FIG. 2, eight recording heads and eight reproducing heads are used. Thus, the number of recording heads and the number of reproducing heads in the structure shown in FIG. 2 are twice those in the structure shown in FIG. 1. In the structure shown in FIG. 2, the rotation of the drum is half of that of the four-head system shown in FIG. 1 so as to suppress the noise of the drum. The azimuth of each of the four recording heads 35, 36, 37, and 38 shown in FIG. 2 is the same. Likewise, the azimuth of each of the four recording heads 39, 40, 41, and 42 is the same. The azimuth of each of the four recording heads 35, 36, 37, and 38 is the reverse of the azimuth of each of the four recording heads 39, 40, 41, and 42. The recording heads 35 (A) and 36 (E) are disposed on the rotating drum at an interval of 180°. The recording heads 37 (C) and 38 (G) are disposed on the rotating drum at an interval of 180°. The recording heads 39 (B) and 40 (F) are disposed on the rotating drum at an interval of 180°. The recording heads 41 (D) and 42 (H) are disposed on the rotating drum at an interval of 180°.

The recording heads 35, 37, 39, and 41 trace the magnetic tape 14 nearly at the same time. Thereafter, the recording heads 36, 38, 40, and 42 trace the magnetic tape 14 nearly at the same time. Since the rotation of the drum is halved and the number of the heads is doubled in comparison with the structure shown in FIG. 1, the same track pattern as that of the four-head system is formed on the magnetic tape. Since four tracks are recorded at the same time, record signals of four channels are sent to the rotary transformer 33. Opposite heads are selected corresponding to the switching pulses 57 received from the servo circuit 58. The reproducing heads 43, 44, 45, 46, 47, 48, 49, and 50 have the same relation as the recording heads 35, 36, 37, 38, 39, 40, 41, and 42.

In the eight-head system shown in FIG. 2, the number of channels of the reproduced signals is four that are twice that of the four-head system shown in FIG. 1. However, since the data rate of the eight-head system is half of that of the four-head system shown in FIG. 1, when input stages for the four channels are added, the structure shown in FIG. 2 can be accomplished by the structure shown in FIG. 1. In addition, the reverse azimuth can be accomplished by the same circuit as the four-head system shown in FIG. 1. Thus, the ECC decoders 21 and 22 (see FIG. 1) and the ECC decoders 55 and 56 can be accomplished by the same IC. The present invention can be applied to each of the four-head type digital VTR (see FIG. 1) and the eight-head type digital VTR (see FIG. 2).

Figure 3:
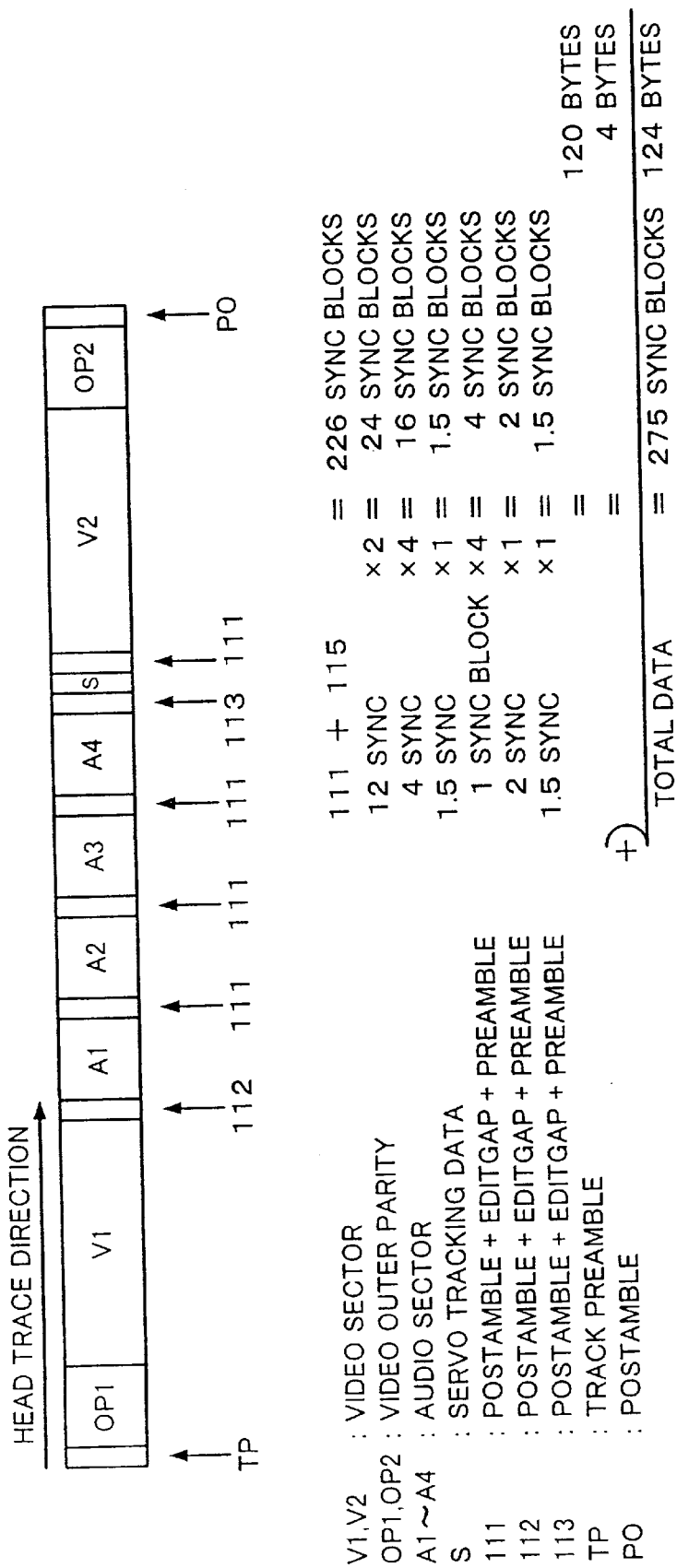
FIG. 3 is a schematic diagram showing an example of the data format of one track.
Figure 5:
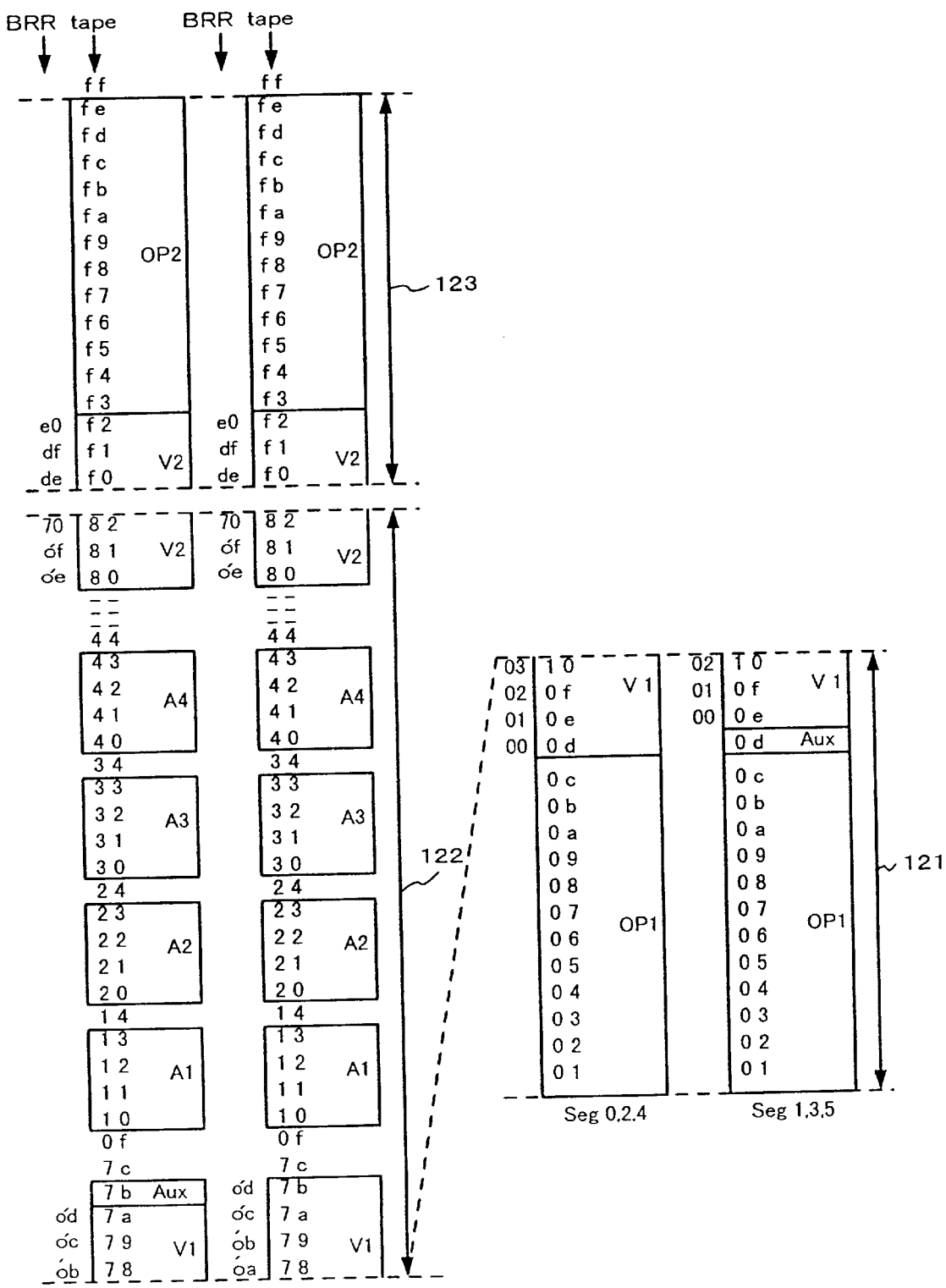
FIG. 5 is a schematic diagram showing the format of ID0 on a track.

FIG. 3 shows the format of one track formed on a magnetic tape. On the track, data is arranged in the head tracing direction. One track has video sectors v1 and v2 and audio sectors A1 to A4. Each of video data and audio data recorded on one track is encoded with a product code. In FIG. 5, OP1 and OP2 represent parities of outer codes in the case that video data is encoded with a product code. A parity of an outer code in the case that audio data is encoded with a product code is recorded in an audio sector. Each track is composed of a plurality of a sync block which equally divided 233 bytes are a sync block.

FIG. 3 shows the length of each portion of one track. In this example, data of 275 sync blocks and 124 bytes is recorded on one track. The video sectors are composed of 226 sync blocks. The time period of one track is around 5.6 ms. A no-record portion is formed at a gap between each sector. This gap is referred to as edit gap. The edit gap is formed so as to prevent a sector that is recorded from erasing an adjacent sector.

Figure 4:
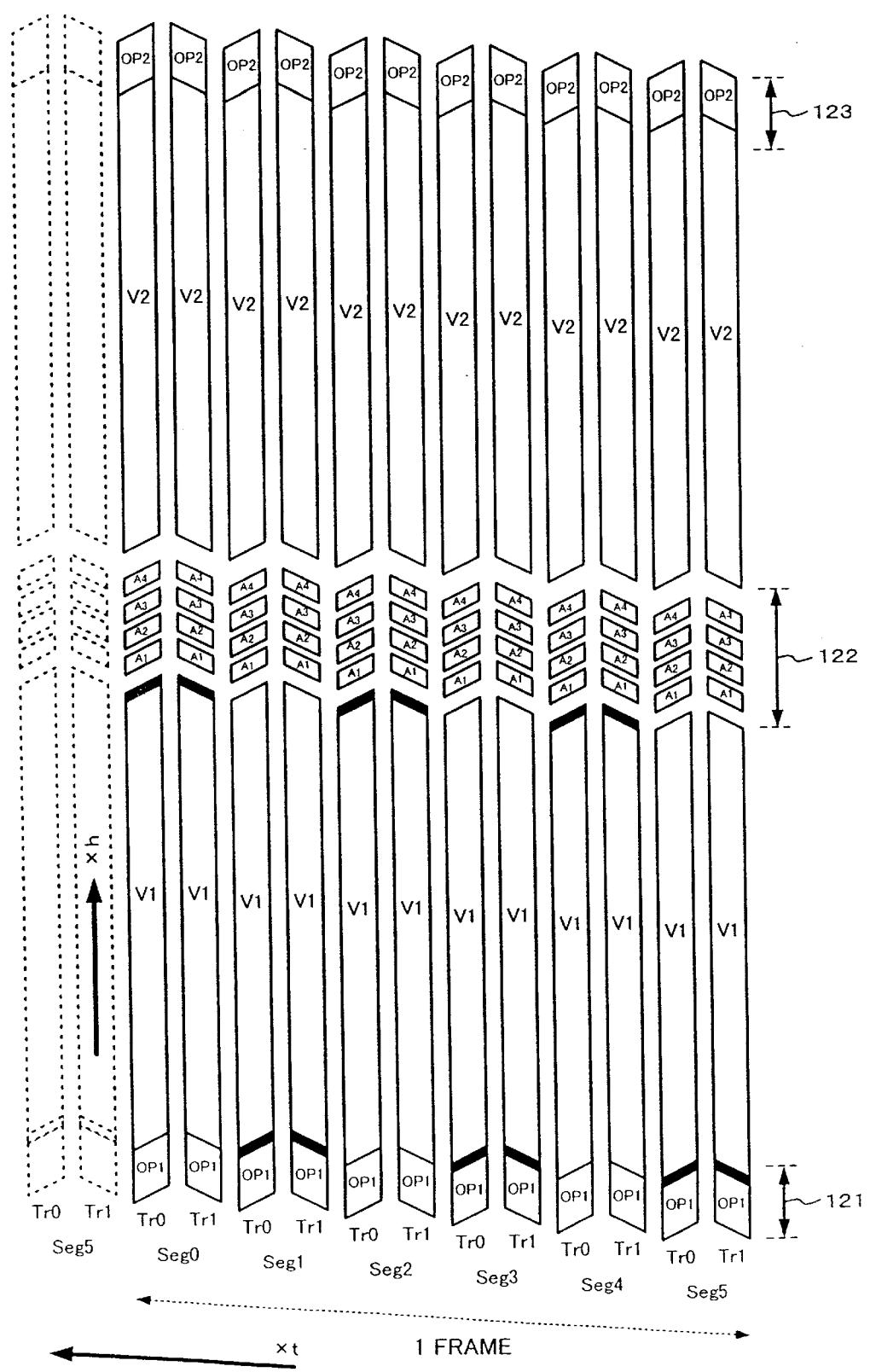
FIG. 4 is a schematic diagram showing an example of a track pattern on a tape.

FIG. 4 shows a pattern of 12 tracks of one frame on a tape. Each track has the format shown in FIG. 3. In FIG. 4, Xt represents a tape traveling direction. Xh represents a head tracing direction. Referring to FIG. 4, adjacent tracks Tr0 and Tr1 are recorded with reverse azimuths. In FIG. 4, a black portion of a video sector v1 represents a record position of an auxiliary data sync block.

Auxiliary data sync blocks are recorded on the tape in such a manner that they are spaced in the width direction. In the example shown in FIG. 4, in each segment composed of a pair of tracks Tr0 and Tr1 recorded with reverse azimuths, record positions of the auxiliary data sync blocks vary. In other words, on tracks of even segments 0, 2, and 4, an auxiliary data sync block is recorded at the last portion of a video sector v1. On the other hand, on tracks of odd segments 1, 3, and 5, an auxiliary data sync block is recorded at the beginning of the video sector v1.

FIG. 5 shows ID0 of each sync block of record regions 121, 122, and 123 shown in FIG. 4 (namely, sync block numbers (each of which is composed of one byte). Sync blocks of one track are identified with sync block numbers.

When auxiliary data sync blocks are recorded in the above-described manner, a situation of which all auxiliary data sync blocks cannot be reproduced due to a scratch in the longitudinal direction of the tape can be prevented. In the example shown in FIG. 4, each auxiliary data sync block is recorded at the center or at the beginning of each track. However, an auxiliary data sync block may be recorded at another position such as the center and beginning of each track or in the middle of a video sector. However, auxiliary data sync blocks are preferably recorded at intervals of 90° on the rotating drum. In addition, record positions of auxiliary data sync blocks are not limited to two positions on each track. In other words, three or more auxiliary data sync blocks may be recorded on each track. In this case, the resistance to a longitudinal scratch is further improved.

In the example shown in FIG. 4, the record positions of auxiliary data sync blocks are alternately changed between the center position and the top position for individual segments. However, the record positions of the auxiliary data sync blocks may be changed in another manner such as the center position, top position, top position, center position, and so forth.

When the record position of each auxiliary data sync block is changed for each track rather than each segment, two auxiliary data sync blocks are recorded for each segment. Thus, in the variable speed reproducing mode, the probability for reading auxiliary data sync blocks can be remarkably improved. Consequently, information of auxiliary data sync blocks can be consistently used without need to use a longitudinal time code. Thus, the auxiliary data sync points can be effectively used for detecting an edit point or the like. In addition, a head for reading a signal in the longitudinal direction and a peripheral circuit thereof can be omitted.

Figure 6A:
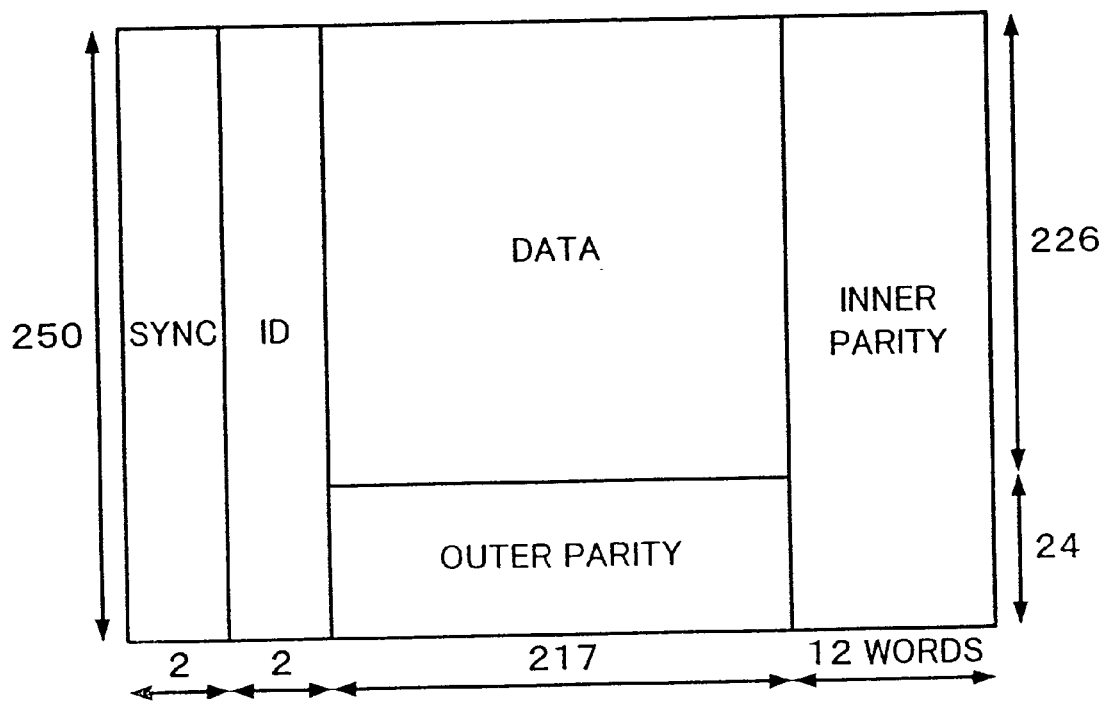
FIGS. 6A and 6B are schematic diagrams for explaining an error correction code and a sync block.

FIG. 6A shows an example of the structure of an error correction code used for video data. Video data for each track is encoded with an error correction code. In other words, video data for one track is arranged as an array of (217×226). The vertical 226 words of the array are encoded with a (250, 226) ReedSolomon code (outer code). Thus, a parity of an outer code of 24 words is added. With the outer code, an error of up to 10 words can be corrected. In addition, an error of up to 24 words can be erasure-corrected.

An ID of two words is added to 217 words (video data or the parity of the outer code) arranged in the horizontal direction of the two-dimensional array. The (217+2=219) words arranged in the horizontal direction are encoded with a (231, 219) Reed-Solomon code (inner code). Thus, a parity of an inner code of 12 words is generated. With the inner code, an error of up to four words is corrected. In addition, an erasure flag for correcting an error with the outer code is generated.

As with the video data, audio data is encoded with a product code. However, the data amount of audio data recorded on one track is different from the data amount of video data recorded on one track.

Figure 6B:
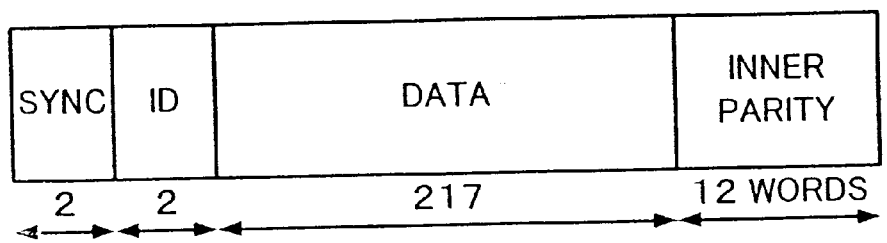

In other words, data is encoded with an outer code. The resultant data including an ID is encoded with an inner code. Data is extracted in the encoding direction of the inner code. A block sync is added to the resultant data. Thus, as shown in FIG. 6B, one sync block composed of 233 bytes is formed. In other words, a block sync of two words is added to (2+217+12=231) words of each line of the array shown in FIG. 6A. If necessary, successive sync blocks are digitally modulated and then recorded on the magnetic tape.

FIG. 7 shows a video data sync block and an auxiliary data sync block on a tape. An ID of each sync block is composed of two words ID0 and ID1. ID0 represents a sync block number. SBN0 is an LSB. SBN7 is an MSB. ID1 has the following bits.

a/v: audio sector/video sector b/a: track number (Tr0, Tr1)

0 to 5: segment number

Frm/Fld: intra-frame encoding/intra-field encoding

HQ/SQ: high quality/standard quality

SFP: shuffling pattern

High-order three bits Frm/Fld, HQ/SQ and SFP of ID1 are the same in six segments (12 tracks) of one frame. These three bits Frm/Fld, HQ/SQ and SFP of ID1 are the same as those in an auxiliary data sync block.

Data necessary for decompressing a signal is recorded to a sync block. Thus, even if pictures of different frames are mixed in a variable speed reproducing mode, each sync block can be decompressed. In a sync block whose error cannot be corrected with an inner code, even if data is corrected with an outer code, ID1 is be corrected with an outer code. Thus, the sync block cannot be used. When ID1 is determined using the rule of majority, data can be restored. However, the circuit scale becomes large. In contrast, according to the present invention, since auxiliary data sync blocks can be securely reproduced, such a problem is solved.

The first one word (HD) of 217 words of each sync block is a data header. The data header includes a one-bit sync error flag along with information that represents a quantizing characteristic of data.

Figure 8:
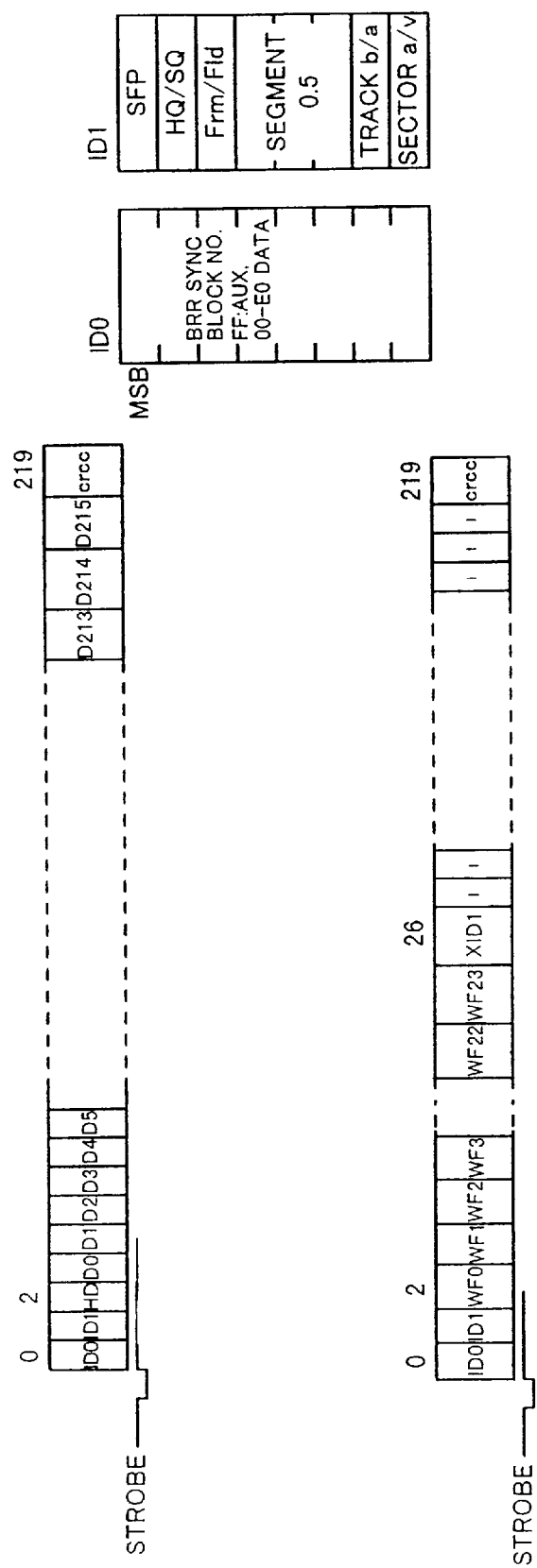
FIG. 8 is a schematic diagram for explaining the format of a data sequence that is output from an ECC decoder.

FIG. 8 shows a video data sync block and an auxiliary data sync block that are sent from the ECC decoders 21 and 22 to the BRR decoders 23 and 24. In this case, it is not necessary to send a parity of an inner code. When sync blocks are input to the ECC decoders 21 and 22, the synchronization is detected by the ECC decoders 21 and 22 using the continuity of ID0. However, when sync blocks are sent to the BRR decoders 23 and 24, the continuity of sync block numbers is lost. Thus, as shown in FIG. 8, sync block numbers of ID0 are renumbered. In addition, the block syncs SY0 and SY1 and the parity of the inner code are removed. Moreover, a check code CRC (Cyclic Redundancy check Code) for detecting a transmission error between ICs is added as shown in FIG. 8. The resultant sync blocks are sent to the BRR decoders 23 and 24.

As shown in FIG. 7, ID1 is followed by a 24 byte compression parameter referred to as weight factor WF. The weight factor WF is followed by XID1 whose high order three bits are the same as those of ID1. XID1 is followed by an AUX portion (182 bytes) that includes such as a time code and user data. When data is sent to the BRR decoders 23 and 24, the weight factor WF is just preceded by ID1 as shown in FIG. 8.

Figure 9:
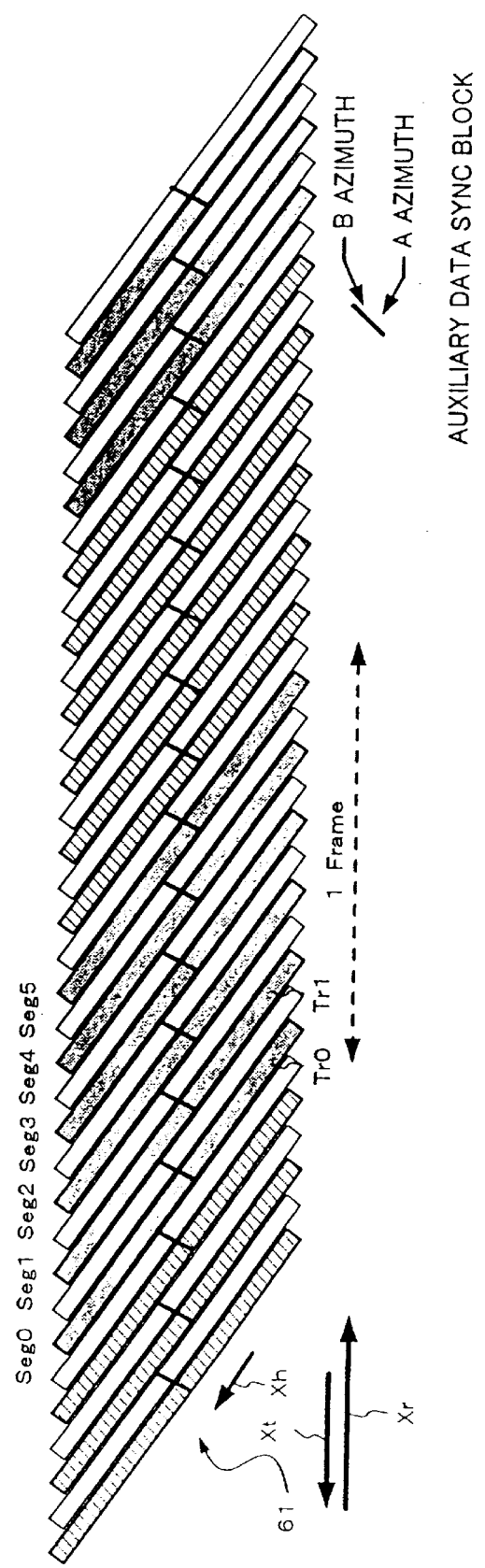
FIG. 9 is a schematic diagram showing record positions of auxiliary data sync blocks of a conventional digital VTR.

According to the embodiment of the present invention, the resistance of auxiliary data sync blocks against a scratch on a tape is improved as described in the following. As shown in FIG. 9, in the conventional digital VTR, an auxiliary data sync block is recorded at a center portion 61 (at the last of a video sector) of each track. In FIG. 9, Xr represents a tape traveling direction. Xh represents a head scanning direction. Xr represents a tracing direction. In this case, when a scratch (longitudinal scratch) takes place at position 61, auxiliary data cannot be reproduced at all. Thus, since the reliability of the auxiliary data is low, it is risky to place important information such as a compression parameter to the auxiliary data. Consequently, the auxiliary data is used for information such as a time code that is redundantly recorded on other tracks.

Figure 10:
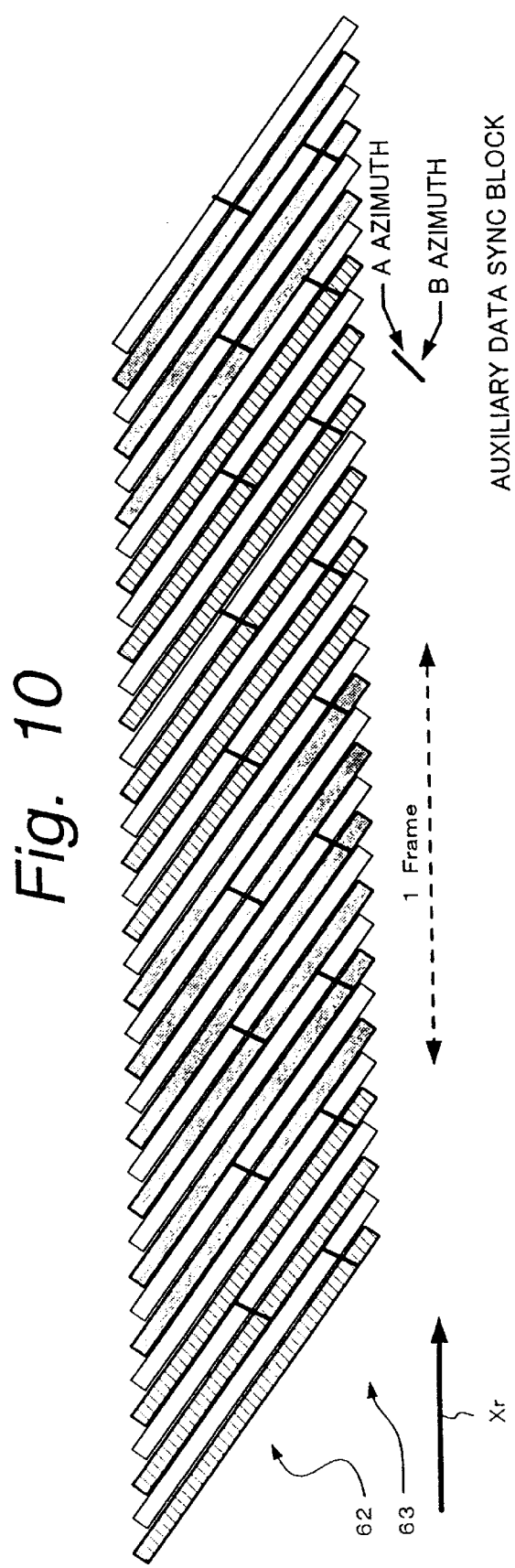
FIG. 10 is a schematic diagram showing record positions of auxiliary data sync blocks according to an embodiment of the present invention.

On the other hand, according to an embodiment of the present invention, as shown in FIGS. 4 and 10, in each even segment, an auxiliary data sync block is recorded at the last position 62 of a video sector v1. In each odd segment, an auxiliary data sync block is recorded at the beginning position 63 of a video sector v1. Thus, since auxiliary data sync blocks are recorded at positions in a zig-zag pattern, even if a longitudinal scratch takes place at the position 62 or 63, auxiliary data sync blocks can be reproduced.

Figure 11:
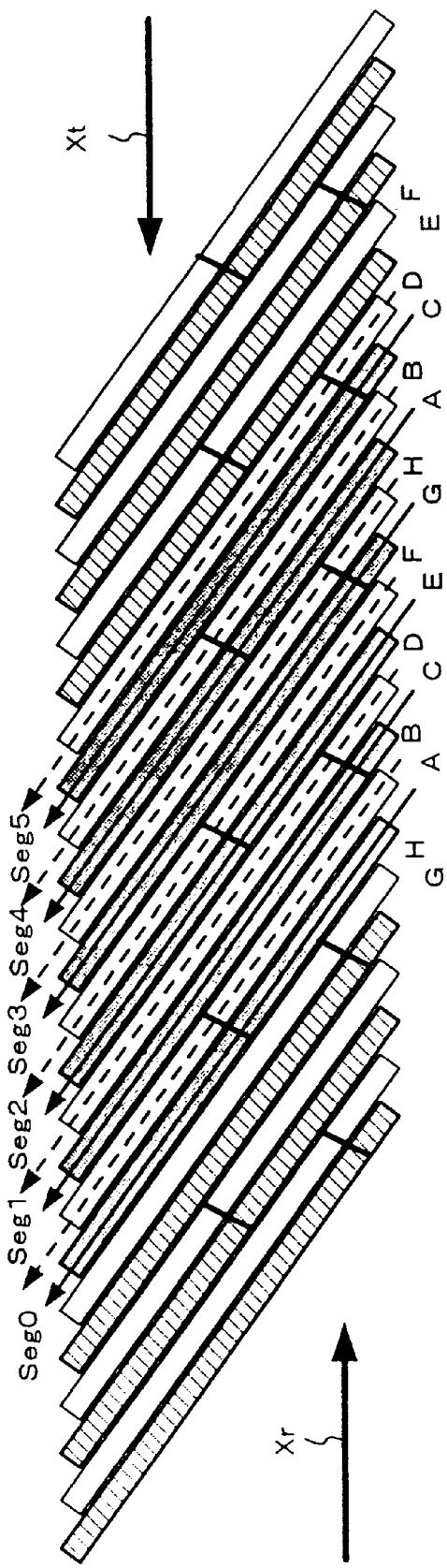
FIG. 11 is a schematic diagram showing a reproduction scanning path (normal reproducing operation) of a conventional digital VTR with eight heads.

Next, the operation of the eight-head system shown in FIG. 2 will be described. FIG. 11 shows tracks of a tape and scanning paths of reproducing heads in the normal reproducing mode. In the eight-head system, in the tape stop state, a time code recorded on a longitudinal track cannot be read. Thus, a time code recorded on an auxiliary data sync block should be reproduced.

Figure 12:
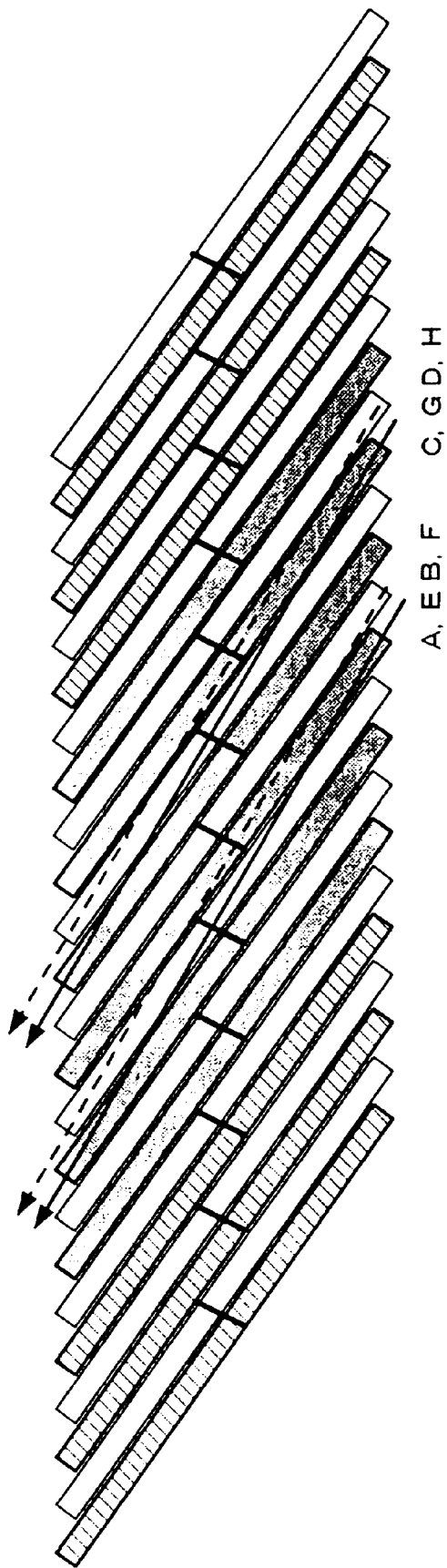
FIG. 12 is a schematic diagram showing a reproduction scanning path (tape stop state) of the conventional digital VTR with eight heads.

When reproducing heads scan tracks as shown in FIG. 12 in the tap stop state, as with the conventional manner, in the case that auxiliary data sync blocks have been recorded at center portions of individual tracks, the azimuth of tracks becomes the reverse of the azimuth of reproducing heads. Thus, auxiliary data sync blocks cannot be reproduced. When a reproducing head with a dynamic tracking function that causing the path thereof to match a track is used, such a problem can be solved. However, since each reproducing head of such an eight-head system does not have such a function, an auxiliary data sync block cannot be read depending on the stop position.

Figure 13:
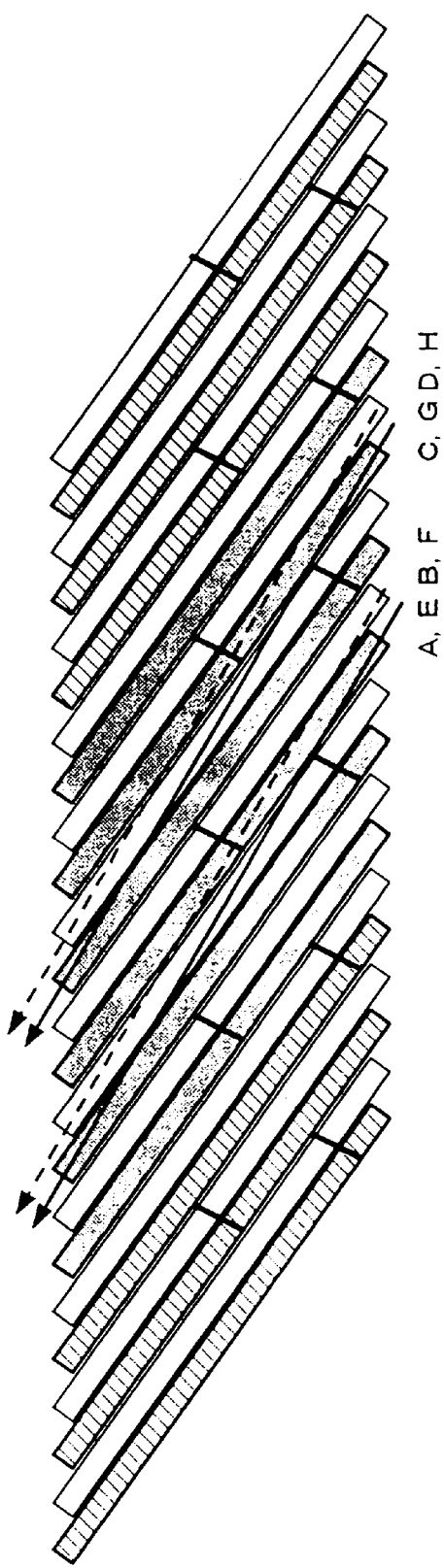
FIG. 13 is a schematic diagram showing a reproduction scanning path (tape stop state) of the digital VTR with eight heads according to the present invention.

On the other hand, according to the embodiment of the present invention, since auxiliary data sync blocks are recorded at positions in a zig-zag pattern, in the stop sate of which a time code in the longitudinal direction cannot be read, a time code can be read from an auxiliary data sync block. FIG. 13 shows the worst example of head paths in such a case. A reproducing head that does not have the dynamic tracking function is a so-called wide head of which the gap width is larger than the track width. Thus, when an arrow that represents the center of a head path contacts a track on the tape, a sufficient reproduction level can be obtained. In the example shown in FIG. 13, heads C and G can read auxiliary data sync blocks at the beginning portions of tracks. Heads D and H can read auxiliary data sync blocks at the center positions of tracks.

Figure 14:
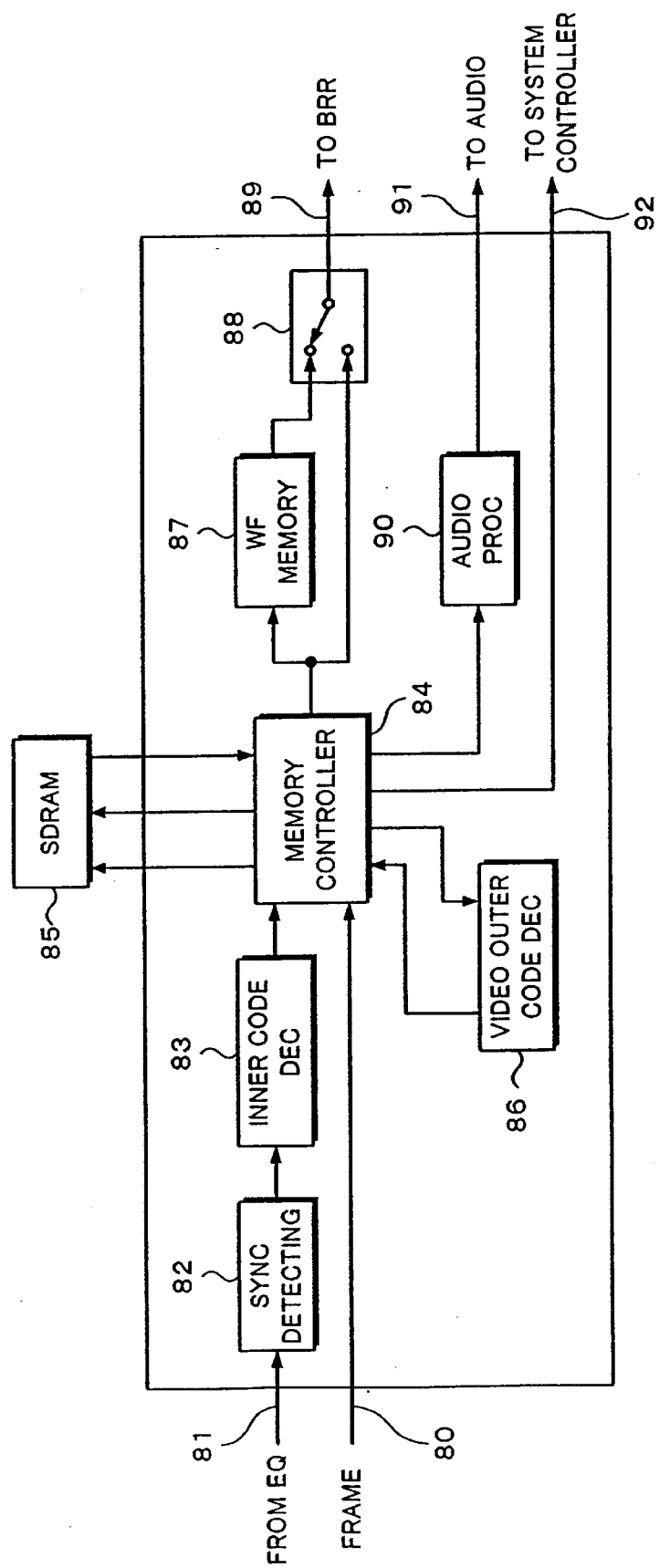
FIG. 14 is a block diagram showing an example of the structure of an ECC decoder according to an embodiment of the present invention.

The error correction code encoding process for data reproduced from a magnetic tape is performed by the ECC decoders 21 and 22. FIG. 14 is a block diagram showing the structure of an ECC decoder 21. FIG. 15 is a timing chart showing the operation of the ECC decoder 21.

A reproduced signal received from the reproducing equalizer 20 shown in FIG. 20 is supplied to an input terminal 81. A synchronization detecting circuit 82 forms a data sequence as shown in FIG. 7 and sends the data sequence to an inner code decoder 83. The inner code decoder 83 corrects an error of the output data of the synchronization detecting circuit 82. The output data of the inner code decoder 83 is stored in an SDRAM 85 through a memory controller 84 at timing 71 shown in FIG. 15. After the SDRAM 85 stores video data for one track, an outer code decoder 86 corrects an error of the output data of the SDRAM 85 at timing 73 shown in FIG. 15.

A memory controller 84 reads data from the SDRAM 85 corresponding to an outer code sequence and sends the resultant data to the outer code decoder 86. Output data of the outer code decoder 86 is written to the SDRAM 85. As shown in FIG. 8, data whose error has been corrected is sent to the BRR decoder 23 shown in FIG. 1 at timing 75 (shown in FIG. 15) of a reference frame pulse 80 that is a reference timing of the system.

After timing 71 other than timing for video data, audio data is sent to an audio processor 90. The audio processor 90 performs an outer code correcting process, a deshuffling process, an error interpolating process, and so forth for the audio data. The resultant data is obtained from an output terminal 91.

Next, with reference to FIGS. 14 and 15, a process for auxiliary data sync blocks will be described. Auxiliary data sync blocks are reproduced at timings 72, 76, 78, and 79 as shown in FIG. 15. The resultant data is stored in the SDRAM 85 as with normal video sync blocks. Thereafter, an error of the data is corrected with an outer code.

The memory controller 84 causes the SDRAM 85 to send auxiliary data sync blocks to the BRR decoder 23 corresponding to the reference frame pulse 80. Before this operation, the memory controller 84 extracts a weight factor WF from each auxiliary data sync block and sends the weight factor WF to a WF memory 87 at timing 74. In other words, the memory controller 84 reads error information of an auxiliary data sync block reproduced at timing 72 from the SDRAM 85. As is clear from FIG. 15, since the auxiliary data sync block reproduced at timing 72 has been corrected with an inner code and an outer code, the probability of which the auxiliary data sync block has an error is very low. When the auxiliary data sync block does not have an error, the memory controller 84 reads the auxiliary data sync block from the SDRAM 85 and writes the weight factor WF and XID1 to the WF memory 87.

If the auxiliary data sync block reproduced at timing 72 has an error, the auxiliary data sync block reproduced at timing 76 is read from the SDRAM 85. When the auxiliary data sync block does not have an error, the weight factor WF and XID1 thereof are written to the WF memory 87. In such a manner, the memory controller 84 determines whether auxiliary data sync blocks have errors in the ascending order of segments of the frame (from segment number=0). An auxiliary data sync block that has no error is stored in the WF memory 87.

When the sending timing is timing 77 rather than timing 75, since auxiliary data sync blocks reproduced at timings 78 and 79 can be referenced, the probability of which data free of an error is obtained is very high. When an auxiliary data sync block that has no error cannot be obtained, video data occasionally has many errors. In addition, since the compression parameter tends to not vary, the WF memory 87 is not updated. Instead, preceding data is used.

A selector 88 adds data stored in the WF memory 87 to the beginning portion of each segment at timing 74 and sends the resultant data to the BRR decoder 23 or the like. The BRR decoder 23 performs the compression code decoding process with the data received from the selector 88.

XID1 at the 28th byte of each auxiliary data sync block is used in the normal reproducing process. The selector 88 changes the high order three bits of ID1 of each sync block for XID1. Thus, even if an auxiliary data sync block has been encoded only with an inner code, ID1 thereof becomes information with very high reliability. If necessary, a circuit (not shown) for determining ID1 corresponding to the rule of majority may be disposed. With an external designation, the circuit may be used.

The above-described substituting process is prohibited in the shuttle reproducing state with a higher tape traveling speed than the recording state. In the shuttle reproducing state, only fragments of data are obtained from a tape. Thus, in the shuttle reproducing state, the outer code correcting process is not performed. In other words, when an error cannot be corrected with an inner code, both ID1 and data have errors. In addition, since a plurality of frames are present, it is meaningless to delimit frames in a time period of the reproducing operation.

In addition to error information, the remaining 182 bytes of an auxiliary data sync block (including a time code) other than the weight factor WF and XID1 for each segment are read from an outer terminal 92 to the system controller. Since the same time code is written to each segment of one frame, it can be read 12 times. Thus, in addition to a longitudinal time code, an error-free time code can be selected by software. Thus, a time code with very high reliability and high updating characteristic can be obtained.

With such a time code process, even if the eight-head system that does not have the dynamic tracking function cannot read a time code from a longitudinal track in the tape stop state, the system can reproduce a time code from an auxiliary data sync block.

In the above-described process, an error-free auxiliary data sync block is read from the external memory 85 in a predetermined time period before data that includes the auxiliary data sync block is sent. However, an auxiliary data sync block can be obtained after an error has been corrected with an inner code and an outer code. In this case, although signal flows become comparatively complicated, the tolerance of timing of the auxiliary data sync block is improved.

It should be noted that the present invention can be applied to different data format for data assignment of a sync block, the number of sync blocks on each track, the number of segments in each frame and different circuit structure from those of the above-described embodiment.

In the above-described embodiment, the case that the present invention is applied to the 1125 lines/60 Hz system was described. However, the present invention is not limited to such a system. In other words, the present invention can be easily applied to the NTSC system with a field frequency of 59.94 Hz. In this case, the frequencies of each interface signal and clock signal are divided by 1.001 (=60/59.94).

In addition, the present invention can be applied to a system that records/reproduces only a video signal or an audio signal.

As described above, the present invention has the following effects.

The accuracy of auxiliary data is improved and the reliability that allows compressed parameters to be stored is accomplished.

A flag necessary for decompressing data can be accurately and easily reproduced.

The reliability of a time code reproduced from a diagonal track can be improved.

A system that has reproducing heads without dynamic tracking function can read a time code in the tape stop state.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A digital information signal recording apparatus for recording a digital information signal onto diagonal tracks of a recording medium, such as a tape, comprising:

record-signal forming means for encoding an input digital information signal with an error correction code to form record-data of a plurality of data units, some of said data units including encoded data and at least one data unit being composed of auxiliary data other than the input digital information signal; and recording means for successively recording record-data onto diagonal tracks of said recording medium so that a plurality of data units including encoded data and at least one data unit being composed of auxiliary data are both recorded on one track of the recording medium, and wherein the record-data recorded on each track is formed in such a manner that the data unit of the one track composed of the auxiliary data is recorded apart from the data units composed of similar type and content auxiliary data in other tracks adjacent to and in the vicinity of the one track.

2. The digital information signal recording apparatus as set forth in claim 1, wherein the auxiliary data, recorded apart from each other in the respective tracks is the same in each track.

3. The digital information signal recording apparatus as set forth in claim 1, wherein at least part of the auxiliary data is added as header information to the plurality of data units including the encoded data.

4. The digital information signal recording apparatus as set forth in claim 3, operable in a variable speed reproducing mode in which the recording medium is fed at a speed different from the feeding speed during recording so that the header information is selectively used to reproduce recorded record-data instead of the auxiliary data.

5. The digital information signal recording apparatus as set forth in claim 1, wherein said recording means comprises rotating magnetic heads, and wherein the azimuths of the rotating magnetic heads that form adjacent tracks are different from each other.

6. The digital information signal recording apparatus as set forth in claim 1, wherein the auxiliary data represents a position on the recording medium.

7. The digital information signal recording apparatus as set forth in claim 1, wherein the input digital information signal is compressed and encoded and then encoded with an error correction code.

8. The digital information signal recording apparatus as set forth in claim 7, wherein the auxiliary data is compressing and encoding controlling information.

9. A digital information recording method for recording a digital information signal onto diagonal tracks of a recording medium, such as a tape, comprising the steps of:

encoding an input digital information signal with an error correction code to form record-data of a plurality of data units, some of said data units including encoded data and at least one data unit being composed of auxiliary data other than the input digital information signal; and successively recording record-data onto diagonal tracks of said recording medium so that a plurality of data units including encoded data and at least one data unit being composed of auxiliary data are both recorded on one track of the recording medium, and wherein the record-data recorded on each track of the recording medium is formed in such a manner that the data unit of the one track composed of the auxiliary data is recorded apart from the data units composed of similar type and content auxiliary data in other tracks, adjacent to and in the vicinity of the one track.

* * * * *